United States Patent [19]

Kodama

[11] Patent Number: 5,414,665
[45] Date of Patent: May 9, 1995

[54] METHOD OF ERASING DATA STORED IN ELECTRICALLY ERASABLE AND PROGRAMMABLE READ ONLY MEMORY DEVICE WITHOUT DETERIORATION OF CHARACTERISTICS

[75] Inventor: Noriaki Kodama, Tokyo, Japan

[73] Assignee: NEC Corporation, Tokyo, Japan

[21] Appl. No.: 222,917

[22] Filed: Apr. 5, 1994

[30] Foreign Application Priority Data

Apr. 5, 1993 [JP] Japan .................................. 5-077303

[51] Int. Cl.[6] .............................................. G11C 11/40
[52] U.S. Cl. ..................................... 365/218; 365/185; 365/900
[58] Field of Search .................... 361/900, 218, 185

[56] References Cited

U.S. PATENT DOCUMENTS 5,255,237 10/1993 Kodama ............................... 365/218
5,295,107 3/1993 Okazawa et al. .................... 365/218

FOREIGN PATENT DOCUMENTS 2223097 9/1990 Japan ................................... 365/218

OTHER PUBLICATIONS

S. Yamada et al., "A self–Convergence Erasing Scheme for a Simple Stacked Gate Flash Eeprom", *IEDM Technical digest*, 1991, pp. 307–310.

*Primary Examiner*—Terrell W. Fears
*Attorney, Agent, or Firm*—Sughrue, Mion, Zinn, Macpeak & Seas

[57] ABSTRACT

Data bits stored in a flash EEPROM are erased by biasing n-type source regions of floating gate type field effect transistors such that accumulated electrons are evacuated as Fowler-Nordheim tunneling current, and, the p-type semiconductor substrate, the n-type source regions and the control gate electrodes are, thereafter, biased to a negative voltage level, a first positive voltage level and a second positive voltage level for injecting hot electrons into the floating gate electrode depending upon the amount of residual electrons in each floating gate electrode, thereby self-calibrating the threshold level of the floating gate type field effect transistors.

10 Claims, 6 Drawing Sheets

METHOD OF ERASING DATA STORED IN ELECTRICALLY ERASABLE AND PROGRAMMABLE READ ONLY MEMORY DEVICE WITHOUT DETERIORATION OF CHARACTERISTICS

FIELD OF THE INVENTION

This invention relates to an electrically erasable and programmable read only memory device (abbreviated as "EEPROM") and, more particularly, to an erasing method of the EEPROM.

DESCRIPTION OF THE RELATED ART

An electrically erasable and programmable read only memory device known as "Flash EEPROM" is equipped with a memory cell array or a plurality of memory cell blocks concurrently erased with a high voltage level.

FIG. 1 illustrates a typical example of a floating gate type field effect transistor serving as a memory cell of the flash EEPROM. The floating gate type field effect transistor is fabricated on a p-type silicon substrate 1, and comprises n-type source and drain regions 2 and 3, a gate insulating film 4 of silicon oxide 10 nano-meter thick covering a channel region between the source and drain regions 2 and 3, a floating gate electrode 5 formed on the gate insulating film 4, a composite gate insulating film structure 6 of 20 nano-meter thick covering the floating gate electrode 5 and a control gate electrode 7 formed on the composite gate insulating film structure 6. In this instance, the composite gate insulating film structure 6 is formed of a silicon oxide film and a silicon nitride film.

A data bit is stored in the floating gate electrode 5 in the form of accumulated electrons, and the electrons accumulated in the floating gate electrode 5 increase the threshold voltage with respect to a voltage level at the control gate electrode 7. The increased threshold voltage is about 8 volts.

The data bit stored in the floating gate type field effect transistor is erased by applying an erasing voltage Ve at, for example, 10 volts to the source region 2 between time t1 to time t2. The drain region 3 is in floating state, and the silicon substrate 1 and the control gate electrode 7 are maintained at the ground voltage level. The time interval between time t1 and time t2 is about 10 nano-second. Then, the accumulated electrons flow from the floating gate electrode 5 to the source region 2 as Fowler-Nordheim tunneling current, and the threshold voltage is recovered to the initial value as low as 2 volts.

However, even if the source voltage and the time interval are regulated to appropriate values for the threshold at 2 volts, a large number of floating gate type field effect transistors of the memory cell array are dispersed in threshold between about 0.8 volt and about 3.5 volts, and some floating gate type filed effect transistors enter into depletion state. Such a wide dispersion can cause insufficient on-current and an error of the read-out data bit, and is undesirable for the flash EEPROM.

Yamada et. al. have proposed a method against the wide dispersion of threshold voltage for EEPROMS in "A SELF-CONVERGENCE ERASING SCHEME FOR A SIMPLE STACKED GATE FLASH EEPROM", IEDM Technical Digest, 1991 pages 307 to 310. According to the paper, after the erasing stage through the Fowler-Nordheim tunneling phenomenon, the drain region 3 and the control gate electrode 7 are grounded, and a positive voltage about 5 volts is applied to the source region 2. Then, the voltage level at the floating gate electrode 5 floats up by 1 to 3 volts due to the capacitive-coupling with the source region 2, and a conductive channel takes place between the drain region 3 and the source region 2. Electrons flow through the conductive channel, and are accelerated in the horizontal electric field around the source region 2. The accelerated electrons produce electron-hole pairs through an avalanche breakdown, and either of, or both, of the electrons and the holes are injected into the floating gate electrodes depending upon the remaining electrons therein. If a large amount of electrons remain in the floating gate electrode 5 after the first erasing stage, the floating gate electrode 5 is close to 1 volt in the presence of the source voltage of 5 volts, and the holes are liable to be injected rather than the electrons. On the other hand, if holes are accumulated in the floating gate electrode 5 due to the excess erase, the floating gate electrode 5 is elevated to about 3 volts, and the electrons are injected into the floating gate electrode 5 rather than the holes. The injected electrons and/or holes change the thresholds, and, accordingly, the floating gate type field effect transistors are calibrated in the threshold. In other words, the thresholds are converged to a target value, and the dispersion ranges between $-0.5$ volt and $+0.5$ volt after the self-calibration.

However, a problem is encountered in the prior art Flash EEPROM in that the holes deteriorate the boundary between the channel region and the gate insulating film 4. In detail, while the holes are being injected, the holes are partially accumulated in the gate insulating film 4, and the holes trapped in the gate insulating film 4 create the surface states beneath the gate insulating film 4. The surface states deteriorates a transconductance, and the holes trapped in the gate insulating film 4 decreases the tunnel-barrier of the gate insulating film 4 against the electrons accumulated in the floating gate electrode 5. Thus, the holes trapped in the gate insulating film 4 deteriorate the characteristics of the floating gate type field effect transistors.

SUMMARY OF THE INVENTION

It is therefore an important object of the present invention to provide a method of erasing data bits which is not causative of deterioration of device characteristics.

To accomplish the object, the present invention proposes to calibrate a threshold by using hot electrons.

In accordance with the present invention, there is provided a method of erasing a data bit stored in a floating gate type field effect transistor having an n-type source region formed in a p-type semiconductor layer, an n-type drain region formed in the p-type semiconductor layer and spaced from the source region, a first gate insulating film covering a channel region between the n-type source region and the n-type drain region, a floating gate electrode on the first gate insulating film and a control gate electrode over the floating gate electrode and electrically isolated therefrom, comprising the steps of: a) evacuating electrons from the floating gate electrode; and b) biasing the p-type semiconductor layer, the control gate electrode and the n-type source region to a negative voltage level, a second positive voltage level and a third positive voltage level, respectively, for injecting electrons produced around the n-type source region into the floating gate electrode, the amount of hot electrons injected into the floating gate electrode being depending upon the amount of electrons left in the floating gate electrode after the step a).

BRIEF DESCRIPTION OF THE DRAWINGS

The feature and advantages of the method of erasing data bits according to the present invention will be more clearly understood from the following description taken in conjunction with the accompanying drawings in which.

DESCRIPTION OF THE PREFERRED EMBODIMENTS

First Embodiment

Figure 1:
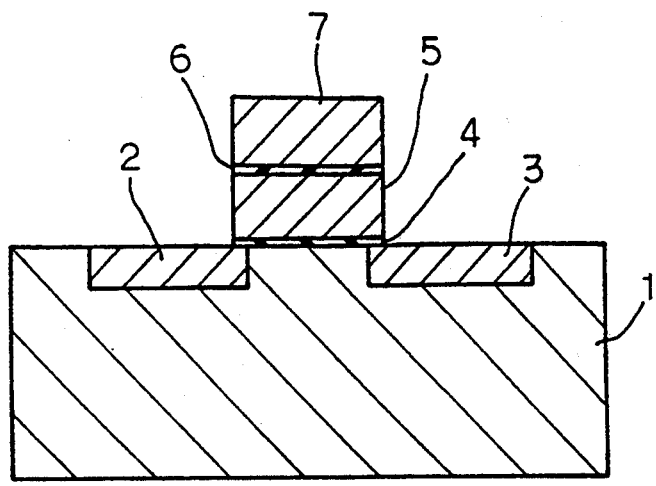
FIG. 1 is a cross sectional view showing the structure of the prior art floating gate type field effect transistor.
Figure 2:
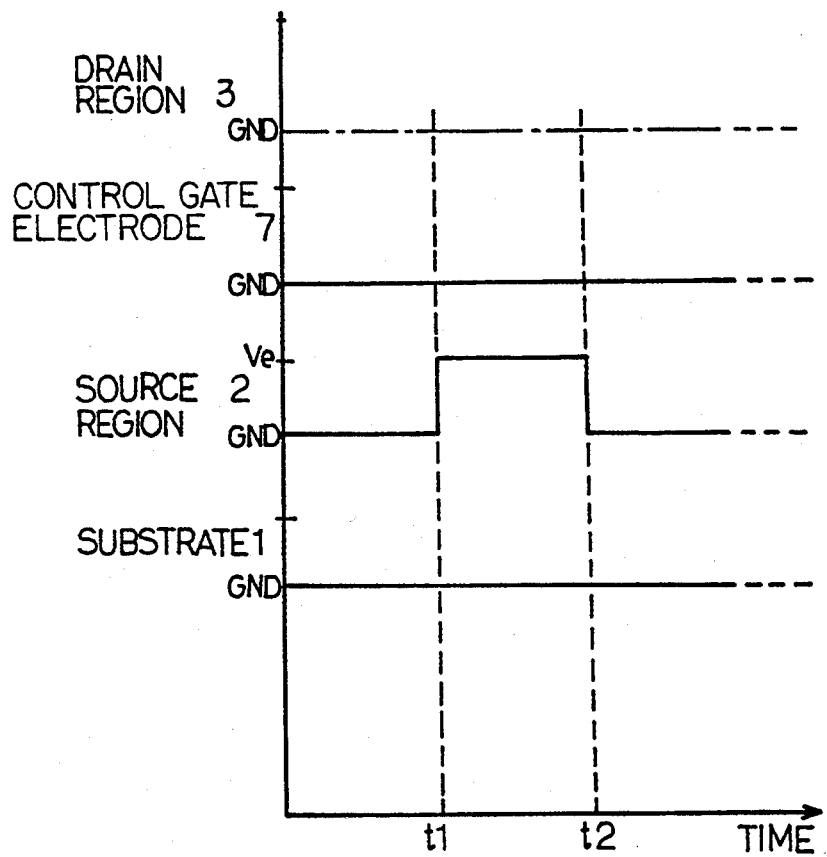
FIG. 2 is a timing chart showing the erasing operation on the prior art floating gate type field effect transistor.
Figure 3:
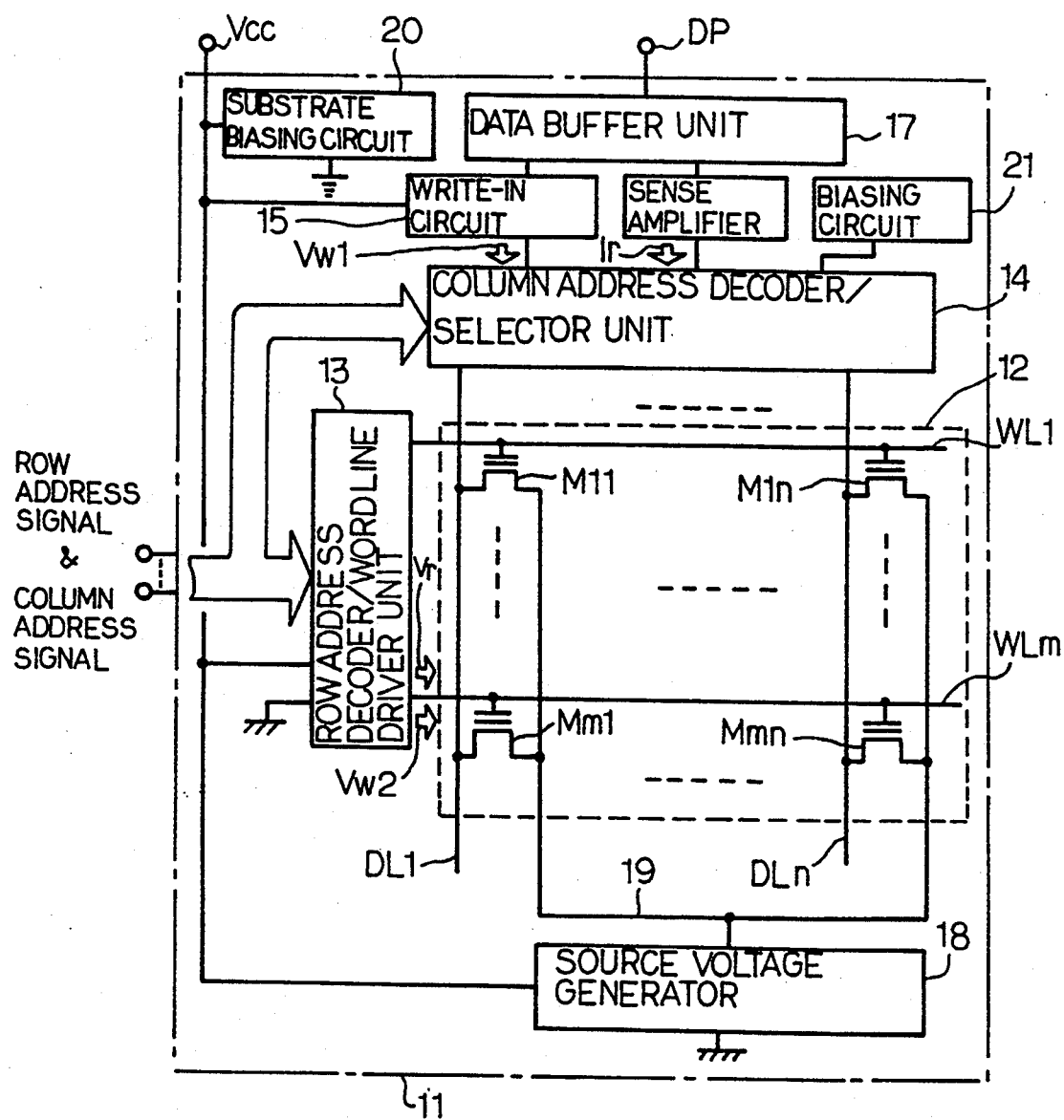
FIG. 3 is a block diagram showing the arrangement of flash EEPROM according to the present invention.
Figure 4:
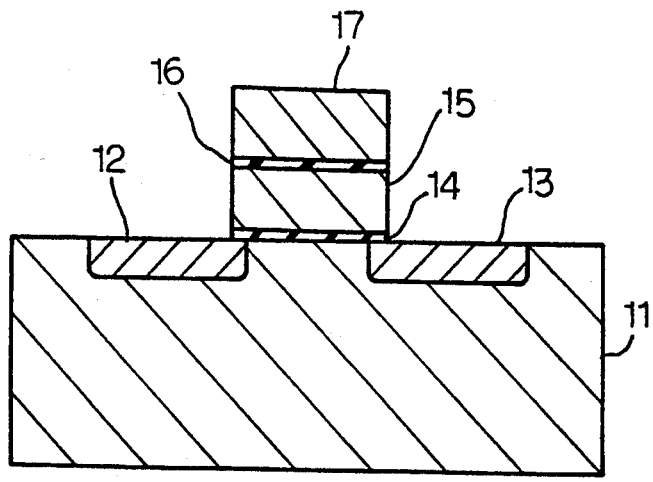
FIG. 4 is a cross sectional view showing the structure of a floating gate type field effect transistor serving as a memory cell incorporated in the flash EEPROM.

Referring to FIG. 3 of the drawings, a flash EEPROM is fabricated on a p-type silicon substrate 11, and comprises a memory cell array 12 for storing data bits, and the memory cell array 12 is implemented by a plurality of memory cells M11, . . . , M1n, . . . , Mm1, . . . and Mmn. The memory cells M11 to Mmn are floating gate field effect transistors, and the structure of each floating gate type field effect transistors is illustrated in FIG. 4.

In detail, the floating gate type field effect transistor is fabricated on the p-type silicon substrate 11, and comprises n-type source and drain regions 12 and 13 spaced apart from each other by a channel region of 0.6 micron, a gate insulating film 14 of silicon oxide 10 nanometer thick covering the channel region, a floating gate electrode 15 formed on the gate insulating film 14, a composite gate insulating film structure 16 covering the floating gate electrode 15 and a control gate electrode 17 formed on the composite gate insulating film structure 16. In this instance, the composite gate insulating film structure 16 is formed of a silicon oxide film and a silicon nitride film, and is equivalent to a silicon oxide film of 20 nano-meter thick. A data bit is stored in the form of electric charge, and logic "1" and logic "0" are corresponding to a high threshold level and a low threshold level, respectively.

Turning back to FIG. 3 of the drawings, the flash EEPROM embodying the present invention further comprises an addressing system for selecting one of the memory cells M11 to Mmn, and has a row address decoder/word line driver unit 13, a column address decoder/ selector unit 14, a plurality of word lines WL1 to WLm respectively associated with the rows of memory cells M11 to Mmn and a plurality of digit lines DL1 to DLn respectively associated with the columns of memory cells M11 to Mmn. Row addresses are respectively assigned to the word lines WL1 to WLm, and column addresses are respectively assigned to the digit lines DL1 to DLn. The word lines WL1 to WLm are connected with the control gate electrodes 17 of the associated floating gate type field effect transistors, and the digit lines DL1 to DLn are connected with the drain regions 13 of the associated floating gate type field effect transistors.

The flash EEPROM embodying the present invention further comprises a write-in circuit 15 connectable through the column address decoder/ selector unit 14 with a selected digit line DL1, . . . or DLn, a sense amplifier 16 also connectable through the column address decoder/selector unit 14 with the selected digit line, a data buffer unit 17 coupled between the sense amplifier/write-in circuit and a data port DP, a source voltage generator 18 connected through a source line 19 with the source regions 13 of the floating gate type field effect transistors, a substrate biasing circuit 20 for changing a biasing voltage at the p-type silicon substrate 11 and a biasing circuit 21 for changing the voltage level on the digit lines DL1 to DLn in an erasing operation.

The flash EEPROM thus arranged has a write-in mode, a read-out mode and an erasing mode. Though not shown in FIG. 3, a controller causes the flash EEPROM to selectively enter into the write-in mode, the read-out mode and the erasing mode with external control signals.

In the write-in mode, the write-in circuit 15 is enabled, and a write-in voltage Vw1 is selectively supplied from the write-in circuit 15 through the column address decoder/selector unit 14 to one of the digit lines DL1 to DLn depending upon the logic level of a write-in data bit. The row address decoder/word line driver unit 13 supplies a write-in voltage Vw2 to one of the selected word lines WL1 to WLm. If the write-in data bit is logic "1" level, the write-in voltage Vw1 is supplied to the selected digit line, and an avalanche breakdown takes place at the p-n junctions between the n-type drain regions 13 and the p-type silicon substrate 11 for producing hot electrons. The write-in voltage Vw2 on the selected word line attracts the hot electrons to the floating gate electrode 15 of one of the memory cells M11 to Mmn, and electrons are accumulated in the floating gate electrode 15. As a result, the threshold of the selected floating gate type field effect transistor is increased to, for example, 8 volts, and the data bit of logic "1" is stored in the selected memory cell.

If the write-in data bit is logic "0" level, the write-in voltage Vw1 is not applied to the selected digit line, and the selected floating gate type field effect transistor keeps a low threshold.

Thus, the write-in data bits are sequentially supplied through the data buffer unit 17 to the write-in circuit 15 in synchronism with an address change, and the floating gate type field effect transistors are selectively changed in threshold level.

In the read-out mode, the row address decoder/word line driver unit 13 drives one of the word lines WL1 to WLm to a read-out voltage level Vr, and the column address decoder/selector unit 14 couples the sense amplifier 16 with one of the digit lines DL1 to DLn. Current Ir flows from the sense amplifier 16 through the column address decoder/selector unit 14 into the selected digit line. The read-out voltage level Vr is regulated to an intermediate level between the high threshold level and the low threshold level. If the accessed data bit is represented by the high threshold level, the selected floating gate type field effect transistor is turned off, and the selected digit line is maintained at a relatively high voltage level. The sense amplifier 16 detects the relatively high voltage level, and produces an output data signal indicative of the accessed data bit of logic "1" level. On the other hand, if the accessed data bit is represented by the low threshold level, the read-out voltage level Vr causes the selected floating gate type field effect transistor to turn on, and the current Ir flows through the selected floating gate type field effect transistor into the source line 19. The source voltage generator 18 supplies the ground voltage level to the source line 19, and the selected digit line becomes relatively low. The sense amplifier 16 detects the relatively low voltage level, and produces the output data signal indicative of the accessed data bit of logic "0" level.

The erasing mode has a first phase for extracting the accumulated electrons from the floating gate electrodes and a second phase for calibrating the threshold level of the floating gate type field effect transistor.

In the first phase, the row address decoder/word line driver unit 13 and the column address decoder/selector unit 14 initially supply the ground voltage level to all of the word lines WL1 to WLm and all of the digit lines DL1 to DLn. The source voltage generator 18 supplies a first erasing voltage Ve1 through the source line 19 to the source regions 12, and the first erasing voltage level Ve1 is about 10 volts in this instance. The substrate biasing circuit 20 maintains the p-type silicon substrate 11 at the ground voltage level. Then, the Fowler-Nordheim tunneling phenomenon takes place, and the accumulated electrons are drawn out from the floating gate electrodes 15 to the source line 19. As described hereinbefore, the floating gate type field effect transistors are dispersed in the threshold level, and some floating gate type field effect transistors may enter into the depletion state due to holes accumulated in the floating gate electrodes 15. When the electrons are evacuated from the floating gate electrodes 15, the source voltage generator 18 recovers the source line 19 to the ground voltage level.

Figure 5:
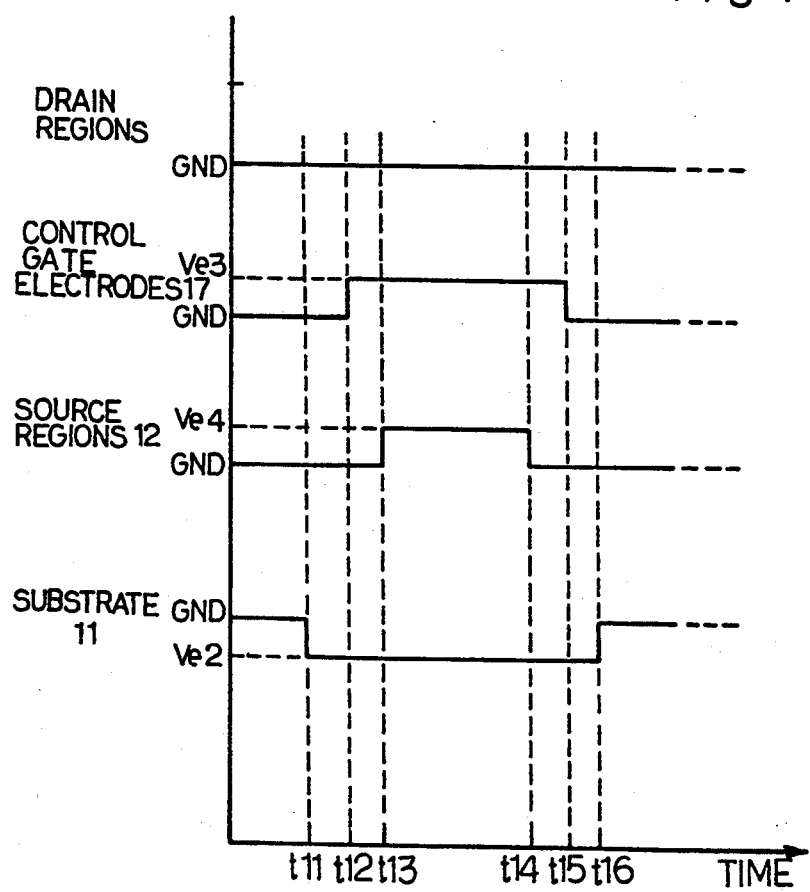
FIG. 5 is a timing chart showing an erasing operation on the floating gate type field effect transistor shown in FIG. 3.

The erasing operation proceeds to the second phase as shown in FIG. 5. In the second phase, the biasing circuit 21 keeps all of the digit lines DL1 to DLn at the ground voltage level, and the substrate biasing circuit 20 negatively biases the p-type silicon substrate 11 to a second erasing voltage Ve2 at time t11. The row address decoder/word line driver unit 13 changes the control gate electrodes 17 to a third erasing voltage level Ve3 at time t12. Further more, the source voltage generator 18 changes the source regions 12 from the ground voltage level to a fourth erasing voltage level Ve4. In this instance, the second erasing voltage level Ve2, the third erasing voltage level Ve3 and the fourth erasing voltage level Ve4 are −3 volts, +2 volts and +3.5 volts, respectively.

The p-n junction between the p-type silicon substrate 11 and the n-type source region 12 is forwardly biased, and holes flows across a depletion layer at the p-n junction into the p-type silicon substrate 11. The holes are accelerated by the electric field in the depletion layer, and produce electron-hole pairs. Parts of the electrons are injected through the gate insulating films 14 into the floating gate electrodes 15, and the amount of electron injected into each floating gate electrode 15 is depending upon the amount of residual electrons in the floating gate electrode. The holes flow into the p-type silicon substrate 11 due to the negative bias, and are not injected into both gate insulating films 14 and the floating gate electrodes 15. By virtue of the injected electrons, the threshold levels are self-regulated to a certain level, and the floating gate type field effect transistors are automatically calibrated in threshold level.

The source voltage generator 18 recovers the source regions 12 to the ground voltage level at time t14, and the self-regulation is completed. The control gate electrodes 17 is recovered to the ground voltage level at time t15, and the p-type silicon substrate 11 is further recovered to the ground voltage level at time t16.

Thus, the self-regulation is carried out by using hot electrons, and the problems inherent in the prior art due to the trapped holes do not take place.

Figure 6:
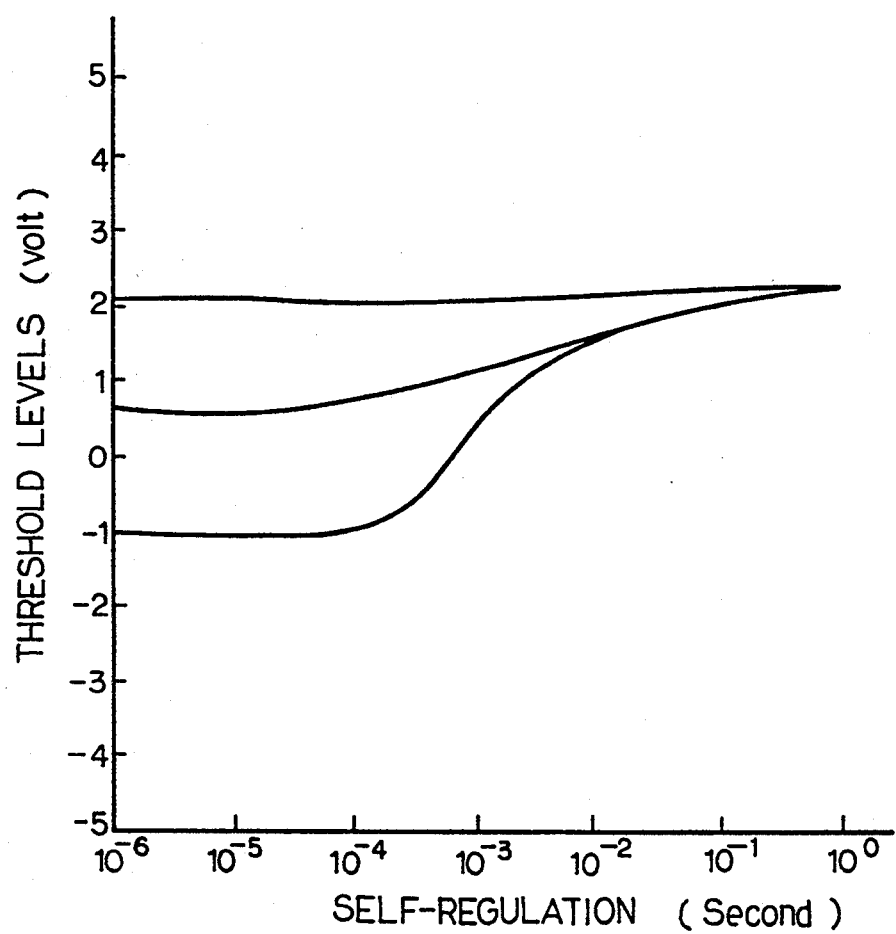
FIG. 6 is a graph showing the relation between threshold levels and a time interval for a self-regulation stage in an erasing operation.

The present inventor confirmed the self-regulation by using the hot electrons. The dispersion of the threshold ranged from −1 volt to +2 volts before the self-regulation. After the-self-regulation over 0.1 second between time t13 and time t14, the dispersion was decreased to less than 0.5 volt as shown in FIG. 6.

Figure 7:
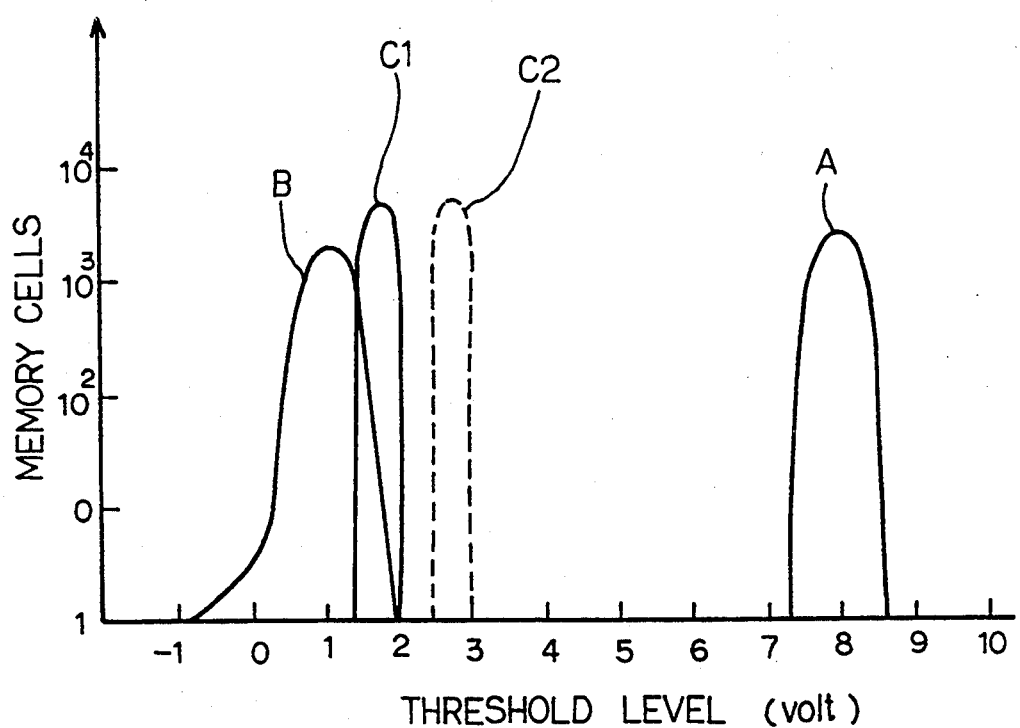
FIG. 7 is a graph showing dispersions of threshold level in terms of a biasing voltage at control gate electrodes.

FIG. 7 illustrates dispersions of the threshold levels of the floating gate type field effect transistors of a 16 kilo-bit flash EEPROM. The threshold levels before the erasing operation were dispersed as indicated by Plots A, and the dispersion ranged in 2 volts with the peak value at 8 volts. After the first phase, the threshold levels were dispersed as indicated by Plots B, and ranged between −1 volt and +2 volts with the peak value at 1 volt. If the second phase was carried out for 0.1 second by biassing the control gate electrodes to +2 volts, the threshold levels were dispersed as indicted by Plots C1, having a range of 0.5 volt with the peak value at 1.7 volts. However, if the biasing voltage at the control gate electrodes was changed to 3 volts, the dispersion of the threshold levels was changed to Plots C2, having a range of 0.5 volt with the peak value at 2.7 volts. Thus, the peak value of the threshold levels may be regulated by changing the biasing voltage at the control gate electrodes 17.

Second Embodiment

Figure 8:
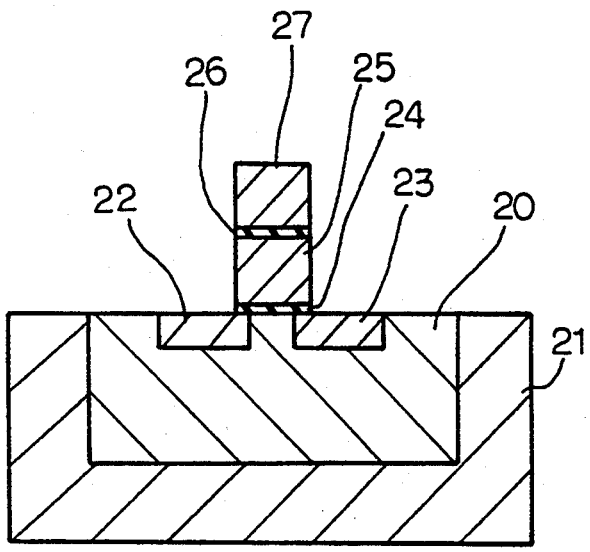
FIG. 8 is a cross sectional view showing the structure of another floating gate type field effect transistor to which the method according to the present invention is applied.

Turning to FIG. 8 of the drawings, another floating gate type field effect transistor is fabricated on a p-type well 20 formed in an n-type silicon substrate 21, and comprises n-type source and drain regions 22 and 23 spaced apart from each other by a channel region, a gate insulating film 24 of silicon oxide covering the channel region, a floating gate electrode 25 formed on the gate insulating film 24, a second gate insulating film 26 covering the floating gate electrode 25 and a control gate electrode 27 formed on the second gate insulating film 26.

In this instance, both p-type well 20 and substrate 21 are biased to the ground voltage level in the first phase and to the negative voltage level in the second phase. The other conditions of the erasing sequence are similar to those of the first embodiment, and no further description is incorporated hereinbelow for the sake of simplicity.

Third Embodiment

Figure 9:
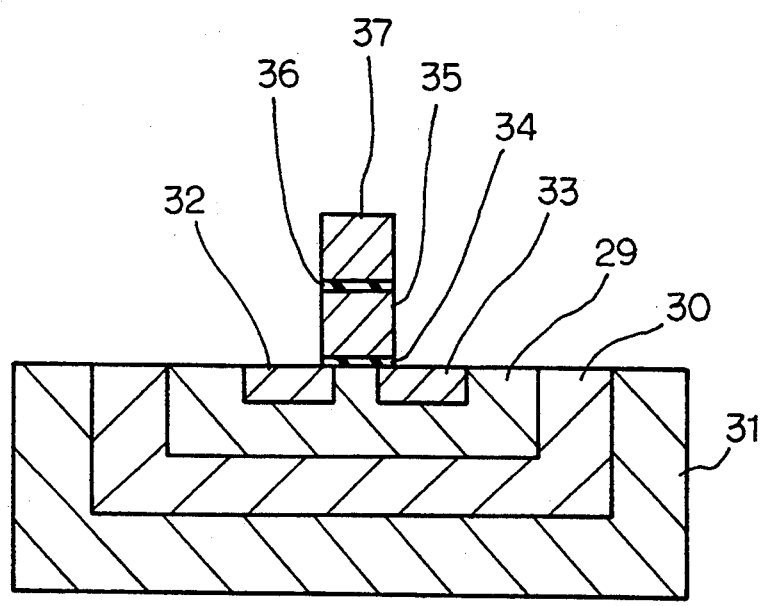
FIG. 9 is a cross sectional view showing the structure of yet another floating gate type field effect transistor to which the method according to the present invention is applied.

Turning to FIG. 9 of the drawings, yet another floating gate type field effect transistor is fabricated on a p-type well 29 formed in an n-type well 30, and the n-type well 30 is formed in a p-type silicon substrate 31. The floating gate type field effect transistor comprises n-type source and drain regions 32 and 33 spaced apart from each other by a channel region, a gate insulating film 34 of silicon oxide covering the channel region, a floating gate electrode 35 formed on the gate insulating film 34, a second gate insulating film 36 covering the floating gate electrode 35 and a control gate electrode 37 formed on the second gate insulating film 36.

In this instance, both p-type well 29 and n-type well 30 are biased to the ground voltage level in the first phase and to the negative voltage level in the second phase. However, the p-type silicon substrate 31 is maintained at the ground voltage level. The other conditions of the erasing sequence are similar to those of the first embodiment, and no further description is incorporated hereinbelow for the sake of simplicity.

As will be appreciated from the foregoing description, the method of erasing data bits calibrates the floating gate type field effect transistors with hot electrons, and the holes are never injected into the floating gate electrodes 15 nor trapped into the gate insulating films. For this reason, the holes never form surface states at the boundary between the p-type silicon substrate and the gate insulating film 14, nor decrease the potential barrier of the gate insulating films 14 against the Fowler-Nordheim tunneling current from the floating gate electrodes 15 to the source regions 12.

Although particular embodiments of the present invention have been shown and described, it will be obvious to those skilled in the art that various changes and modifications may be made without departing from the spirit and scope of the present invention. For example, a flash EEPROM according to the present invention has a plurality of memory cell arrays, and data bits are written into and read out from the memory cell arrays in parallel. Moreover, the memory cell array 12 may be divided into a plurality of memory cell blocks, and the erasing operation according to the present invention may be carried out on a selected memory cell block.

Moreover, the evacuation of electrons may be carried out under different conditions. For example, the source and drain regions are maintained in floating state, and the semiconductor substrate or the well are biased to the ground voltage level. In this situation, if a negative voltage level such as, for example, −16 volts is applied to the control gate electrode, electrons are evacuated from the floating gate electrode to the substrate or the well as a Fowler-Nordheim tunneling current.

What is claimed is:

1. A method of erasing a data bit stored in a floating gate type field effect transistor having an n-type source region formed in a p-type semiconductor layer, an n-type drain region formed in said p-type semiconductor layer and spaced from said source region, a first gate insulating film covering a channel region between said n-type source region and said n-type drain region, a floating gate electrode on said first gate insulating film and a control gate electrode over said floating gate electrode and electrically isolated therefrom, comprising the steps of:

a) evacuating electrons from said floating gate electrode; and
   b) biasing said p-type semiconductor layer, said control gate electrode and said n-type source region to a negative voltage level, a second positive voltage level and a third positive voltage level, respectively, for producing electron-hole pairs, the holes of said electron-hole pairs flowing through said p-type semiconductor layer biased with said negative voltage level, the hot electrons of said electron-hole pairs produced around said n-type source region being injected into said floating gate electrode, the amount of hot electrons injected into said floating gate electrode being dependent upon the amount of electrons left in said floating gate electrode after said step a).

2. The method as set forth in claim 1, further including the step of changing said second positive voltage level dependent upon a target threshold level for the floating gate type field effect transistor.

3. The method as set forth in claim 1, further including the step of drawing out said electrons from said floating gate electrode as a Fowler-Nordheim tunneling current.

4. The method as set forth in claim 1, further including the step of forming a memory cell array of a flash type electrically erasable and programmable read only memory device from a plurality of said floating gate type field effect transistors.

5. The method as set forth in claim 1, in which said p-type semiconductor layer serves as a substrate.

6. The method as set forth in claim 1, further comprising the step of forming said p-type semiconductor layer as a well in an n-type semiconductor substrate.

7. The method as set forth in claim 1, further comprising the step of forming said p-type semiconductor layer as a well in an n-type well which in turn is formed in a p-type semiconductor substrate.

8. The method as set forth in claim 1, further including the step of evacuating said electrons from said floating gate electrode to said n-type source region as a Fowler-Nordheim tunneling current in step a).

9. The method as set forth in claim 1, further including the step of evacuating said electrons from said floating gate electrode to said p-type semiconductor layer.

10. A method of erasing a data bit stored in a floating gate type field effect transistor having an n-type source region formed in a p-type semiconductor layer, an n-type drain region formed in said p-type semiconductor layer and spaced from said source region, a first gate insulating film covering a channel region between said n-type source region and said n-type drain region, a floating gate electrode on said first gate insulating film and a control gate electrode over said floating gate electrode and electrically isolated therefrom, comprising the steps of:

a) biasing said n-type source region, said n-type drain region, said control gate electrode and said p-type semiconductor layer to a first positive voltage level, a ground voltage level, the ground voltage level and the ground voltage level, respectively, for evacuating electrons accumulated in said floating gate electrode as a Fowler-Nordheim tunneling current;

b) biasing said p-type semiconductor layer, said control gate electrode, said n-type source region and said n-type drain region to a negative voltage level, a second positive voltage level, a third positive voltage level, and the ground voltage level, respectively for producing electron-hole pairs around the p-n junction between said n-type source region and said p-type semiconductor layer, electrons of said electron-hole pairs being accelerated for injecting into said floating gate electrode for calibrating a threshold of said floating gate type field effect transistor, holes of said electron-hole pairs flowing into said p-type semiconductor layer, the amount of electrons injected into said floating gate electrode being dependent on the amount of electrons left in said floating gate electrode in said step a).

* * * * *